United States Patent
Chen et al.

(10) Patent No.: US 11,055,459 B2
(45) Date of Patent: Jul. 6, 2021

(54) HETEROGENEOUS MINIATURIZATION PLATFORM

(71) Applicant: INTERNATIONAL BUSINESS MACHINES CORPORATION, Armonk, NY (US)

(72) Inventors: Qianwen Chen, Yorktown Heights, NY (US); Li-Wen Hung, Mahopac, NY (US); Wanki Kim, Chappaqua, NY (US); John U. Knickerbocker, Monroe, NY (US); Kenneth P. Rodbell, Sandy Hook, CT (US); Robert L. Wisnieff, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 57 days.

(21) Appl. No.: 16/433,675

(22) Filed: Jun. 6, 2019

(65) Prior Publication Data
US 2019/0311082 A1   Oct. 10, 2019

Related U.S. Application Data

(62) Division of application No. 15/626,582, filed on Jun. 19, 2017, now Pat. No. 10,380,284, which is a (Continued)

(51) Int. Cl.
*H01L 25/065* (2006.01)
*H01L 25/07* (2006.01)
(Continued)

(52) U.S. Cl.
CPC ........ *G06F 30/331* (2020.01); *G06F 15/7803* (2013.01); *G06F 15/7807* (2013.01); (Continued)

(58) Field of Classification Search
CPC ......... H01L 24/73; H01L 24/97; H01L 24/95; H01L 25/065; H01L 25/0652; (Continued)

(56) References Cited

U.S. PATENT DOCUMENTS

2019/0035749 A1*   1/2019   Dalmia ............ H01L 21/76877

OTHER PUBLICATIONS

List of IBM Patents or Patent Applications Treated as Related dated Jun. 6, 2019 2 pages.

* cited by examiner

*Primary Examiner* — Thanhha S Pham
(74) *Attorney, Agent, or Firm* — Tutunjian & Bitetto, P.C.; Erik Johnson (57) ABSTRACT

A method of forming an electrical device is provided that includes forming microprocessor devices on a microprocessor die; forming memory devices on an memory device die; forming component devices on a component die; and forming a plurality of packing devices on a packaging die. Transferring a plurality of each of said microprocessor devices, memory devices, component devices and packaging components to a supporting substrate, wherein the packaging components electrically interconnect the memory devices, component devices and microprocessor devices in individualized groups. Sectioning the supporting substrate to provide said individualized groups of memory devices, component devices and microprocessor devices that are interconnected by a packaging component.

19 Claims, 6 Drawing Sheets

Related U.S. Application Data division of application No. 15/333,832, filed on Oct. 25, 2016, now Pat. No. 9,735,077.

(51) Int. Cl.
*G06F 30/331* (2020.01)
*H01L 23/31* (2006.01)
*H01L 25/00* (2006.01)
*H01L 23/00* (2006.01)
*H01L 21/683* (2006.01)
*H01L 25/11* (2006.01)
*H01L 21/56* (2006.01)
*H01L 25/18* (2006.01)
*G06F 15/78* (2006.01)
*G06F 15/80* (2006.01)

(52) U.S. Cl.
CPC ........ *G06F 15/7857* (2013.01); *H01L 21/561* (2013.01); *H01L 21/6835* (2013.01); *H01L 23/3128* (2013.01); *H01L 24/17* (2013.01); *H01L 25/065* (2013.01); *H01L 25/0655* (2013.01); *H01L 25/071* (2013.01); *H01L 25/112* (2013.01); *H01L 25/115* (2013.01); *H01L 25/18* (2013.01); *H01L 25/50* (2013.01); *G06F 15/803* (2013.01); *H01L 21/568* (2013.01); *H01L 2221/6834* (2013.01); *H01L 2221/68327* (2013.01); *H01L 2221/68368* (2013.01); *H01L 2221/68381* (2013.01); *H01L 2224/08225* (2013.01); *H01L 2224/11002* (2013.01); *H01L 2224/16227* (2013.01); *H01L 2224/32225* (2013.01); *H01L 2224/73204* (2013.01); *H01L 2224/73253* (2013.01); *H01L 2224/80006* (2013.01); *H01L 2224/81005* (2013.01); *H01L 2924/1205* (2013.01); *H01L 2924/1206* (2013.01); *H01L 2924/1306* (2013.01); *H01L 2924/13051* (2013.01); *H01L 2924/13091* (2013.01); *H01L 2924/14* (2013.01); *H01L 2924/1421* (2013.01); *H01L 2924/1432* (2013.01); *H01L 2924/1436* (2013.01); *H01L 2924/1437* (2013.01); *H01L 2924/15311* (2013.01); *H01L 2924/19041* (2013.01); *H01L 2924/19105* (2013.01)

(58) Field of Classification Search
CPC . H01L 25/0655; H01L 25/0657; H01L 25/07; H01L 25/071; H01L 25/072
See application file for complete search history.

HETEROGENEOUS MINIATURIZATION PLATFORM

BACKGROUND

Technical Field

The present invention generally relates to microelectronics, and more particularly to employing wafer processing technology to create electrical components at the nanoscale and microscale level.

Description of the Related Art

Methods and equipment are needed to create components that can be used in a heterogeneous system miniaturization platform for healthcare applications, smart tag applications, automotive applications, Internet of Things (IoT) as well as for providing for secure uses in other fields. The platforms needed are to permit integration at the millimeter, micron and nano sizes for one or more dimensions for system integration at the active and passive components level, subsystem level and supports integrated electronics. The platforms are needed to support heterogeneous integration at low cost and low power to systems in healthcare, industry, government and automotive applications at low volume production (<10,000 to <100,000), intermediate volume production (100,000 to 10M) and very high volume production (>10M to >1B) per year.

SUMMARY

The methods, and structures disclosed herein can provide for creating integrated millimeter, micron and nano sized heterogeneous systems in low volume to high volume production at low cost, as well as providing component sizes at the nanoscale, microscale and millimeter sale. In accordance with one embodiment of the present disclosure, the methods, structures and systems disclosed herein can create integrated millimeter, micron and nano sized systems in low to very high volume at low cost. In some embodiments, the methods, structures and systems disclosed herein provide an integrated electronics platform and appropriate packaging integration solution to support active and passive components such as active silicon microprocessors, memory and other circuits along with, polymer, ceramic, glass or metal packaging platforms that can support the miniaturized electronics, and also support larger batteries, antenna, inductor coils, sensors and application compatible form factors from bio compatible implantable solutions with hermetic seals and rechargeable inductor coils and/or ultra small X & Y dimensions but long z dimension such as compatible with needle/probe or catheter insertions and/or wearable systems with a larger flexible electronic electrodes, antenna, inductor coils and/or battery and moisture resistant coating around the electronics to support reliability in the presence of moisture, sweat or other body fluids to microsystems to support internet of things (IoT) sensors, robotics, industry and equipment monitoring sensors, automotive sensors, security systems and other applications. These applications can have unique form factor requirements, may have a one time use or may have extended lifetimes of decades and require unique energy solutions and support for one or more modes of communication including wired, wireless RF, optical, sound or ultrasound to alternative methods.

In some embodiments, the structures, methods, equipment and application examples for Internet of Things (IOT) integration of components, subsystems and integrated products that leverage wafer scale and panel scale processing to create structures, processes, equipment and products to support applications needing small electronics integration subsystems, sensors and for some applications full heterogeneous system solutions. The size reduction from current>100,000's to >1000's of mm cube volume of heterogeneous systems to 100's to few 10's of mm cube size to sizes in the <1 mm cube or even<0.01 mm cube volume can support heterogeneous integration using wafer, panel level and other mass integration methods that support mass production for volume products, support cost reduction at level of orders of magnitude from current product sizes and costs and support the adoption of very low power systems with integrated energy management, small energy solutions from rechargeable batteries and capacitors, single use batteries and energy scavenging and/or externally powered devices to low power disposable systems or subsystems. These small electronics sub-systems can be integrated with larger antenna, electrodes and/or batteries to provide an integrated internet of things (IoT) product such as a healthcare device for medical trending, a smart tag for supply chain tracking or healthcare pill conformance verification, blister pack tracking or for other applications.

In one embodiment, a method of forming an electrical device is provided that includes forming microprocessor devices on a microprocessor wafer and die; forming memory devices on an memory device wafer and die, forming field programmable gate array (FPGA) devices on a FPGA wafer and die; heterogeneous function wafers and die, forming sensors and components or devices on a component wafer and die; and forming a plurality of heterogeneous packaging devices on a heterogeneous packaging integration wafer, panel or multi-purpose die or package along with associated post assembly and integration encapsulation or hermetic sealing. Transferring a plurality of each of said microprocessor devices, memory devices, field programmable gate array (FPGA) devices, heterogeneous function wafer and die or system on a chip functionality, component devices and packaging components to a supporting substrate, wherein the packaging components electrically interconnect the memory devices, component devices, microprocessor devices and other devices in individualized groups. Sectioning the supporting substrate to provide said individualized groups of memory devices, component devices and microprocessor devices that are interconnected by a packaging component.

In another embodiment, a system for forming an electrical device is provided that includes a microprocessor die containing a plurality of microprocessor devices; a memory device die containing a plurality of memory devices; a component die containing a plurality of component devices; and a packaging die containing a plurality of packaging devices. The system for forming electrical devices may also include at least one transfer substrate for transferring a plurality of each of said microprocessor devices, memory devices, component devices and packaging components to a supporting substrate. The packaging components electrically interconnect the memory devices, component devices and microprocessor devices in individualized groups.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

Methods and equipment are needed to create components that can be used in a miniaturization platform for healthcare applications and smart tag application that can be integrated with micro-sized and nano-sized subcomponents and devices at ultra-low cost for volume production. One challenge facing the industry is to create heterogeneous integrated micro and nano systems in volume at low cost, low power consumption, as well as integrated heterogeneous systems or subsystems on the millimeter volumetric scale, e.g., 1 $mm^3$ and much smaller. It has been determined that the use of materials including one or more of the following silicon, polymer, ceramic, glass, or metal packaging platforms can support our miniaturization structures, methods and applications, as well as support system communication options including wired and wireless use of electrical connections, radio frequency, (RF), optical, ultra-sound, near field communications (NFC) or other communications and/or power transfer methods. As will be described in greater detail throughout the present disclosure, a structure, method and application for the use of a small and thinned silicon package form factor is provided, in which the package includes integrated wiring, and/or wire-bonding and/or wireless interconnection and flip chip connection, or alternate component interconnection to interconnect small sub-components for a system. The structure, method and application for the use of the small and thinned silicon package form factor can provide for the volume manufacturing of sensors, smart tags, batteries, capacitors, inductors, sub-systems or other systems and subcomponents. The size package and integrated function can be from under 5 microns in the x (depth), y (width) and z (height) directions, to being on the millimeter scale. For example, the size package and integrated function can be on the order of 1 millimeter or greater in the x (depth), y (width) and z (height) directions.

The sub components may contain one or more of the following functions selected from the group consisting of microprocessor, micro-controller, cognitive micro-controller, field programmable gate array (FPGA), power management, memory, phase change memory, non-volatile memory, sensors, optical, RF, near field communication (NFC), sound communication, capacitors, batteries, alternate energy sources, antenna, transducers, photovoltaics, mirrors, lens, optical interconnections, hybrid energy solutions, inductors, drug delivery devices, closed loop sensing and action subsystems and combinations thereof. The use of stacked structures is also disclosed, in which larger components act as packages for smaller components, such as antenna and/or power sources, providing a base for other system functions that can include, but is not limited to, microprocessors, micro-controllers, cognitive controllers, FPGA, power management, memory, phase change memory, non-volatile memory, sensors, optical, radio frequency (RF) transmitters and receivers, near field communication (NFC), sound communication, capacitors, photovoltaics, inductors, drug delivery devices, closed loop sensing and action subsystems and combinations thereof.

In some embodiments, the methods and structures disclosed herein may employ stacked structures in which a larger component acts as packages for smaller components, such as an antenna and/or power source providing a base for other system functions including, but not limited to, microprocessor, micro-controller, cognitive controller, FPGA, power management, memory, phase change memory, non-volatile memory, sensors, optical, RF, NFC, sound communication, capacitors, photovoltaics and combinations thereof.

The methods, structures and tooling for performing the methods may employ conductive adhesives for interconnection and/or integration. The methods, structures and tool for performing the described methods may employ rigid structures for some system structures, such as the circuitry of the device, and may employ flexible structure for some larger components, such as antenna, batteries, photovoltaics and sensory electrodes. The flexible structures may also function as adhesives. The methods and structures disclosed herein are now described in greater detail with reference to FIGS. 1-10.

Figure 1:
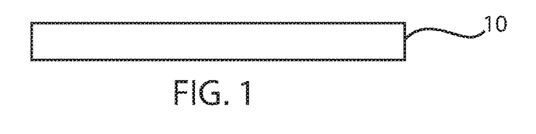
FIG. 1 is a side cross-sectional view depicting of a device wafer for use with the methods and structures for providing miniaturization platforms, in accordance with one embodiment of the present disclosure.

FIG. 1 depicts one embodiment of a wafer 10 for use with the methods and structures for providing miniaturization platforms. In some embodiments, the methods and structures disclosed herein employ wafer integration technology to create components and integrated sub-components at the micron and nanosize scale that can be hermetically sealed to water ($H_2O$) and oxygen ($O_2$) as subsystems for internet of things (IOT), wearable electronics and smart tag applications with bio-compatibility, environmentally compatibility bond and debond technology with the ability to have wireless communications and recharge.

In some embodiments, the wafer 10 may be composed of a semiconductor material. In some embodiments, the wafer 10 is composed of a type IV semiconductor or a type III-V semiconductor material. By "type IV semiconductor" it is meant that the semiconductor material includes at least one element from Group IVA (i.e., Group 14) of the Periodic Table of Elements. Examples of type IV semiconductor materials that are suitable for the fin structure include silicon (Si), germanium (Ge), silicon germanium (SiGe), silicon doped with carbon (Si:C), silicon germanium doped with carbon (SiGe:C), and a combination thereof. Typically, the semiconductor substrate 5 is composed of silicon (Si), e.g., single crystal silicon. In other embodiments, the semiconductor substrate 5 may be composed of a type III-V semiconductor substrate. The term "III-V semiconductor material" denotes a semiconductor material that includes at least one element from Group IIIB of the Periodic Table of Elements under the Old International Union of Pure and Applied Chemistry (IUPAC) classification system, or Group 13 of the New International Union of Pure and Applied Chemistry classification system; and at least one element from Group VB of the Periodic Table of Elements, or Group 15 of the New International Union of Pure and Applied Chemistry classification system. In some embodiments, the III-V semiconductor material that provides the III-V semiconductor substrate 5 may be selected from the group of (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), gallium nitride (GaN) and combinations thereof. The wafer 10 may be a bulk semiconductor substrate, or the wafer 10 may also be a semiconductor on insulator (SOI) substrate, such as a silicon (Si) layer overlying a buried oxide layer.

Still referring to FIG. 1, the wafer 10 may include any number of electrical components and sensors. The wafer 10 may include a number of electrical devices and components, such as semiconductor devices or memory devices and/or sensors For example, the substrate may include transistors, e.g., field effect transistors (FET), fin type field effect transistors (FinFETs), bipolar junction transistors (BJTs), nanowire, FET and/or BJT sensors, thin film transistors (TFTs) and combinations thereof; memory devices, such as random access memory (RAM), dynamic random access memory (DRAM), embedded dynamic access memory (EDRAM), flash memory and combinations thereof; and passive electrical devices, such as resistors and capacitors. The sensors may include light wavelength sensors, resistance sensors, heat sensors, bio-nano sensors, bio-electrochemical sensors, optical sensors, electrical sensors and combinations thereof. The wafers 10 may also include power sources, such as primary batteries, secondary batteries, bio and ecologically compatible reuseable batteries, rechargeable batteries such as but not limited to Si ion based batteries and single use or multi-use disposable batteries. The wafers 10 may also include transmission structures, such antennae for transmitting and receiving signals.

The aforementioned electrical components and sensors, which may be of nanoscale, microscale or macroscale (e.g., 1 mm or larger), may be formed on the wafer using a variety of subtractive and/or additive methods. Additive methods may include deposition processes, such as chemical vapor deposition (CVD), e.g., plasma enhanced chemical vapor deposition (PECVD), or physical vapor deposition, e.g., plating, electroless plating, electroplating, or atomic layer deposition (ALD) or a combination thereof. Subtractive methods can include etch processes, such as reactive ion etch (RIE), deep reactive ion etch (DRIE), chemical etch, laser dicing/ablation or other etch or removal processes which can be conducted following the formation of etch masks formed by processes including photolithography, e.g., dielectric hard masks, or photoresist masks or through use of scanning ablation or other removal methods. The formation of the electrical components may be referred to as wafer fabrication of die. It is also noted that the aforementioned components, memory devices, and microprocessors may be configured to provide a secure system by incorporating secure components and architectures where and when necessary.

Figure 2:
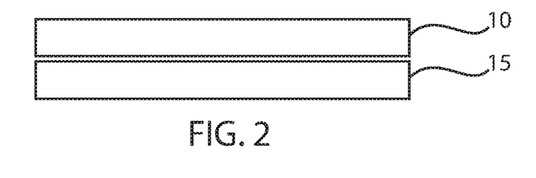
FIG. 2 is a side cross-sectional view depicting bonding of the device wafer depicted in FIG. 1 to a first handling wafer.

FIG. 2 depicts bonding of the wafer 10 depicted in FIG. 1 to a handling structure 15. Hereafter the wafer 10 that includes the electrical devices, e.g., components and sensors (described above), may be referred to as the device wafer 10, and the handling structure 15 may be referred to as a first handling wafer 15. The first handling wafer 15 may be composed of any material having a thickness that provides sufficient rigidity for supporting the thinned and sectioned portions of the device wafer 10 that include separate electrical device structures, that can be referred to as die. In some embodiments, the first handling wafer 15 may be composed of a semiconductor material, such as a type IV semiconductor material, e.g., silicon, and/or type III-V semiconductor material. In other embodiments, the first handling wafer 15 may be composed of a dielectric material, such as ceramic, composite, silicon oxide, quartz, sapphire, silicon carbide, silicon nitride or a glass wafer, substrate or panel with controlled planarity, finish, optical transparency, coefficient of thermal expansion, temperature stability and chemical resistance. In yet other embodiments, the first handling wafer 15 may be composed of a metal or metal composite and have an appropriate surface finish or coating. In some examples, the device wafer 10 is joined to the handling wafer 15 using bonding methods that employ adhesives. In other embodiments, the device wafer 10 is joined to the handling wafer 15 using thermal bonding, which can include thermal bonding between oxide containing layers that are put into contact with each other under pressure at an elevated temperature.

Figure 3A:
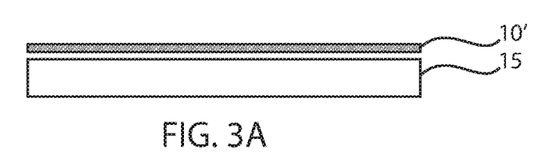
FIG. 3A is a side cross-sectional view depicting wafer thinning of the device wafer depicted in FIG. 2, in which the wafer includes components and sensors.

FIG. 3A illustrates thinning of the device wafer 10, in which the device wafer 10 includes the aforementioned electrical devices, e.g., components and sensors. Wafer thinning may include a preferred process of coarse grinding, fine grinding and followed by a polishing or chemical mechanical planarization method. Other thinning techniques may use planarizing, grinding, chemical mechanical planarization (CMP) and thinning by etching, which is typically applied to the backside of the device wafer 10 opposite the side that the components and electrical devices are most proximate to. Wafer thinning may also include spalling methods. In some embodiments, the thickness of the device wafer 10 typically begins at a thickness of about 780 microns for 300 mm wafers and about 730 microns for 200 mm wafers and then ranges from 500 microns to under 50 microns in many applications and from 50 microns to under 20 microns for many applications in this embodiment for the thickness of device wafer 10. In some cases, the assembly of subcomponents or portions of the subassembly may be comprised of components of 10 to 150 microns thickness and the integration of 2 or more component structures may provide that the integrated components have a combined thickness of 20 microns to 100 microns or 100 microns to 500 microns.

Figure 3B:
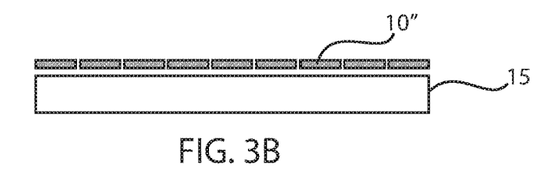
FIG. 3B is a side cross-sectional view depicting a variety of components being made using singulation steps following the device wafer thinning step that is depicted in FIG. 3A, in accordance with one embodiment of the present disclosure.

FIG. 3B depicts a variety of components being made using singulation steps following the device wafer thinning step that is depicted in FIG. 3A. Singulation (also referred to as die cutting or dicing) of the device wafer 10, is the sectioning of the device wafer 10 so that individual electronic devices and components 10" are associated with separate portions of the device wafer 10. For example, in the manufacturing of micro-electronic devices, die cutting, dicing or singulation is a process of reducing a wafer containing multiple identical integrated circuits to individual dies each containing one of those circuits. During this process, the device wafer 10 with up to thousands of circuits is cut into rectangular pieces, each called a die. In between those functional parts of the circuits, a thin non-functional spacing is foreseen where a saw, a laser or preferably of deep reactive ion etch can safely cut the wafer without damaging the circuits utilizing a minimum singulation width and therein utilizing a minimal active surface of the wafer so as to permit a maximum number of die or components to be fabricated with the wafer fabrication, the thinning process and the heterogeneous integration method to support the low cost heterogeneous integrated system cost.

In accordance with some embodiments of the methods disclosed herein, singulation may be provided using anisotropic etching. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present invention include ion beam etching, plasma etching or laser ablation. In some other embodiments, singulation is performed with a water-cooled circular saw with diamond-tipped teeth.

Figure 4A:
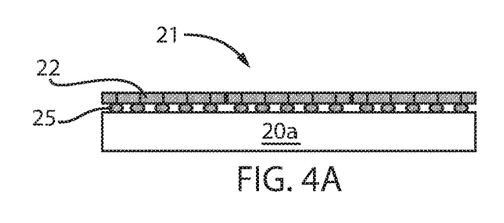
FIG. 4A is a side cross-sectional view of a microprocessor die, in accordance with one embodiment of the present disclosure.
Figure 4B:
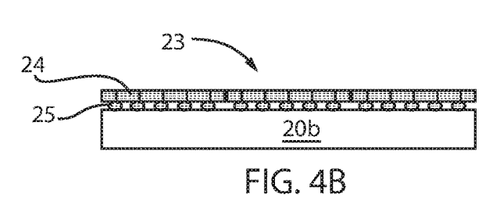
FIG. 4B is a side cross-sectional view of a memory die, in accordance with one embodiment of the present disclosure.
Figure 4C:
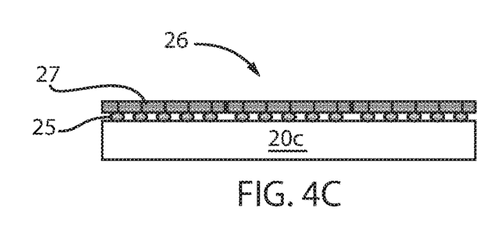
FIG. 4C is a side cross-sectional view of a component die, in accordance with one embodiment of the present disclosure.

FIGS. 4A-4C depict a variety of components being made by the process sequence described with reference to FIGS. 1-3B, in which following singulation the individual electronic devices and components 10" are removed from the first handling wafer 15 and engaged to a second handling wafer 20a, 20b, 20c, 20d. In some embodiments, the individual electronic devices and components 10" that depicted in FIG. 3B are joined to the second handling substrate 20a, 20b, 20c, 20d, as depicted in FIGS. 4A-4C, using solder bump processing, in which the solder bumps are identified by reference number 25. In accordance with solder bump processing, pads are metalized on the surface of the individual electronic devices and components 10" that are defined in FIG. 3B, and solder dots are deposited on each of the pads. The solder may be tin/lead based solder or may be lead free solder such as, from the SnAg, SnCu, SnAgCu, In, InSn, InSnBi, InBi or other alloys and compositions. The solder dots may be deposited using physical vapor deposition (PVD), with sputtering, with electrochemical plating methods or with injection molded solder (IMS) techniques. The solder dots may then be brought into contact with the second handling substrate 20a, 20b, 20c, 20d, in which the solder may be heated to remelt and connect the individual electronic devices and components 10" to the second handling substrate 20a, 20b, 20c, 20d. Joining, reflow, remelt, hot gas, laser, thermal compression bonding/joining may be provided by heat with a controlled ambient atmosphere compatible with the targeted interconnection allow, die and packaging or alternate method. Following connection of the individual electronic devices and components 10" to the second handling substrate 20a, 20b, 20c, 20d, the first handling substrate 15 may be removed. In one example, the first handling substrate 15 may be removed by laser ablation to break the adhesive bond between the first handling substrate 15 and the individual electronic devices and components 10". In some embodiments, the solder dots may be omitted at this stage of the process flow.

FIG. 4A illustrates one embodiment of individual electronic devices and components 10" that are connected to a second handling substrate 20a, which provide microprocessor die 21. The microprocessor die 21 may include at least one semiconductor device, such as a transistor, field effect transistor (FET), metal organic semiconductor field effect transistors (MOSFETS), complementary metal oxide semiconductor (CMOS), Fin type Field Effect Transistor (FinFET), bipolar junction transistor (BJT), heterojunction bipolar junction transistor (HBT), and combinations thereof. The microprocessor die 21 may also include micro-controllers, and power management devices. The aforementioned devices are provided by the transferred individual electronic devices and components 10" from the device wafer 10.

In some embodiments, the microprocessor die 21 includes at least one microprocessor 22, e.g., computer processor, which incorporates the functions of a computer's central processing unit (CPU) on a single integrated circuit (IC), or a few integrated circuits. The microprocessor can be a multipurpose, clock driven, register based, programmable electronic device which accepts digital or binary data as input, processes it according to instructions stored in its memory, and provides results as output. Microprocessors can use both combinational logic and sequential digital logic.

Although FIG. 4A only illustrates three separate microprocessor 22, the methods and structures disclosed herein are not limited to only this example, as any number of individual electronic devices and components 10" may be transferred to the second handling wafer 20a to provide the microprocessor die 21. For example, the number of separate microprocessors 22 may range from 1 to 10,000,000 or in some embodiments greater. In other examples, the number of separate microprocessors 22 on the microprocessor die 21 may be equal to 1, 5, 10 microprocessors, 50 microprocessors, 100 microprocessors, 1,000 microprocessors, 2,000 microprocessors, 3,000 microprocessors, 4,000 microprocessors, 5,000 microprocessors, 10,000 microprocessors, 50,000 microprocessors, 100,000 microprocessors, 250,000 microprocessors, 500,000 microprocessors, 1,000,000 microprocessors, 10,000,000 microprocessors, and any range of microprocessors including a lower limit and a lower limit provided by the aforementioned examples.

FIG. 4B illustrates one embodiment of individual electronic devices and components 10" that are connected to a second handling substrate 20b, which provide a memory die 23. The memory die 23 may include at least one memory device, such as a memory, phase change memory, non-volatile memory, volatile memory and combinations thereof. In some embodiments, the memory device may be provided by static random access memory (SRAM), dynamic random access memory (DRAM), embedded dynamic access memory (eDRAM), flash memory, phase change memory and combinations thereof. Each individual memory device is illustrated by reference number 24. The aforementioned memory devices are provided by the transferred individual electronic devices and components 10" from the device wafer 10. Similar to the number of microprocessors of the microprocessor die 21, although the memory die 23 depicts only three memory devices 24, the present disclosure is not limited to only this example. The number of memory devices 24 present on the memory die 23 can be equal to any range of numbers described above for the number of microprocessors 22 on the microprocessor die 21.

FIG. 4C illustrates one embodiment of individual electronic devices and components 10" that are connected to a second handling substrate 20c, which provide a component die 26. The component die 26 may include at least one electrical component 27, such as sensors, optical, radio frequency (RF) transmitters and receivers, near field communication (NFC), sound communication, batteries, capacitors, photovoltaics, and combinations thereof. In one embodiment, the component 27 may be transmit (Tx)/receive (Rx) transmitters or a sensor for sensing light wavelength or other ambient conditions. The aforementioned memory devices are provided by the transferred individual electronic devices and components 10" from the device wafer 10. Similar to the number of microprocessors of the microprocessor die 21, although the component die 26 depicts only three memory devices 27, the present disclosure is not limited to only this example. The number of memory devices 27 present on the memory die 26 can be equal to any range of numbers described above for the number of microprocessors 22 on the microprocessor die 21.

Figure 4D:
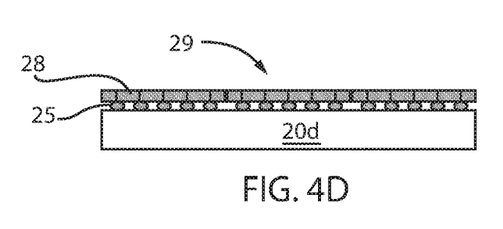
FIG. 4D is a side cross-sectional view of a packaging die, in accordance with one embodiment of the present disclosure.

FIG. 4D illustrates one embodiment of individual electronic devices and components 10" that are connected to a second handling substrate 20d, which provide a packaging die 29. The packaging die 29 may include packaging components 28 that provided integrated circuit packaging for one of the final stages of electrical device fabrication, e.g., semiconductor device fabrication, in which the tiny block of semiconducting material is encapsulated in a supporting case that prevents physical damage and corrosion. The case, known as a "packaging component", supports the electrical contacts which connect the device, e.g., components of the device, to a circuit board. Similar to the number of microprocessors of the microprocessor die 21, although the component die 26 depicts only three memory devices 27, the present disclosure is not limited to only this example. The number of memory devices 27 present on the memory die 26 can be equal to any range of numbers described above for the number of microprocessors 22 on the microprocessor die 21.

Figure 5:
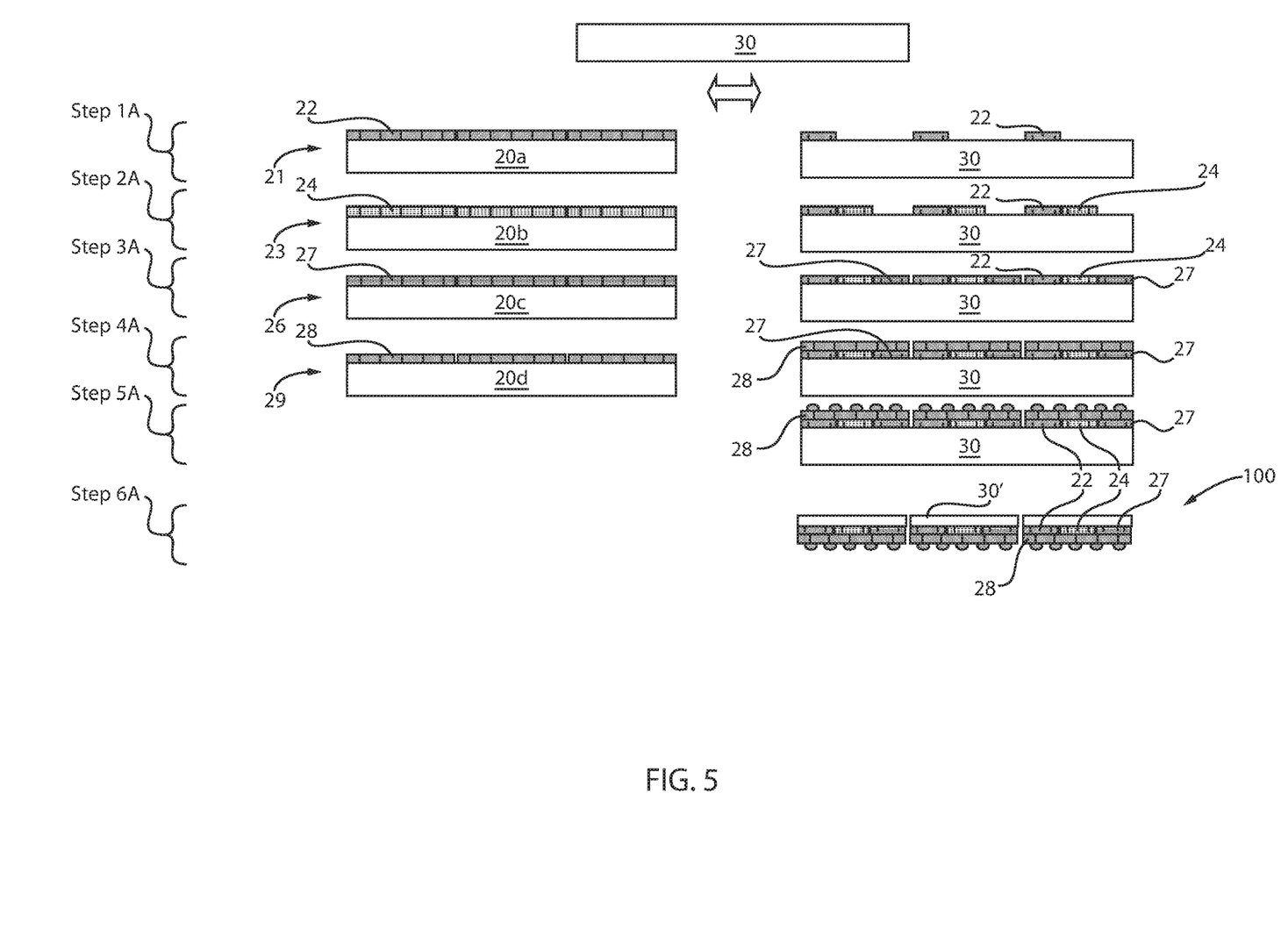
FIG. 5 is a side cross-sectional view depicting a process flow for creating components in accordance with a miniaturization platform, in which the process flow includes a die first wiring scheme, in accordance with one embodiment of the present disclosure.

FIG. 5 depicting a process flow for creating components in accordance with a miniaturization platform, in which the process flow includes a die first wiring scheme starting with transferring microprocessors 22, or other type electrical electronic devices and components (hereafter collectively referred to as microprocessors 22), from the microprocessor die 21 to a third handling substrate 30. The third handling substrate 30 is similar to the above described second handling substrate 20a, 20b, 20c, 20d. Therefore, the above description of the second handling substrate 20a, 20b, 20c, 20d is suitable for describing the third handling substrate 30.

The microprocessors 22 may be die mounted to the third handling substrate 30 with the die input/output (I/O) facing upward at Step 1A. Mounting of the microprocessors 22 to the handling substrate 30 may employ adhesives; deposited oxides, e.g., silicon oxide ($SiO_2$); deposited nitrides, e.g., silicon nitride; deposited metals, e.g., titanium; and barrier layers, such as deposited metal nitride, e.g., titanium nitride, tantalum nitride and combinations thereof. In other embodiments bonding of the microprocessors 22 to the third handling substrate 30 may include oxide to oxide bonding, such as thermal oxide bonding under thermal processing; laser bonding; or other alternate method as used in microelectronics fabrication.

In some embodiments, the microprocessors 22 are directly transferred to the third supporting substrate 30. In other embodiments, the microprocessors 22 are first transported from the microprocessor die 21 to an intermediate transfer substrate, wherein in a following step the microprocessors 22 are transferred from the intermediate transfer substrate to the third handling substrate 30.

At step 2A, a memory device 24 can be transferred from the memory die 23 to the third handling substrate 30. The memory device 24 may be die mounted to the third handling substrate 30 with the die input/output (I/O) facing upward. Mounting of the memory devices 24 to the third handling substrate 30 may employ adhesives; deposited oxides, e.g., silicon oxide ($SiO_2$); deposited nitrides, e.g., silicon nitride; deposited metals, e.g., titanium; and barrier layers, such as deposited metal nitride, e.g., titanium nitride, tantalum nitride and combinations thereof. In other embodiments bonding of the memory die 23 to the third handling substrate 30 may include oxide to oxide bonding, such as thermal oxide bonding under thermal processing; laser bonding; or other alternate method as used in microelectronics fabrication. Similar to the transfer of the microprocessors 22 to the third handling substrate 30, the memory devices 24 may be transferred from the memory die 23 directly to the third handling substrate 30, or the memory devices 24 may first be transferred to an intermediate transfer substrate, wherein in a following step the memory devices 24 are transferred from the intermediate transfer substrate to the third handling substrate 30.

It is noted that the memory devices 24 and the microprocessors 22 may be positioned on the third handling substrate 30 substantially adjacent to one another, i.e., on the same level. In other embodiments, the memory devices 24 and the microprocessors 22 may be stacked, i.e., vertically stacked atop one another.

At step 3A of the process flow depicted in FIG. 5, the component devices 26 from the component die 27 are transferred to the third handling substrate 30 after the memory devices 24, and the microprocessors 22 have been transferred to the third handling substrate 30. The component devices 26 may include batteries, and transmitters, or any of the devices that have been described above when describing the component die 27. Mounting of the component devices 26 to the third handling substrate 30 may employ adhesives; deposited oxides, e.g., silicon oxide ($SiO_2$); deposited nitrides, e.g., silicon nitride; deposited metals, e.g., titanium; and barrier layers, such as deposited metal nitride, e.g., titanium nitride, tantalum nitride and combinations thereof. In other embodiments bonding of the component devices 26 to the third handling substrate 30 may include oxide to oxide bonding, such as thermal oxide bonding under thermal processing; laser bonding; or other alternate method as used in microelectronics fabrication. Similar to the transfer of the microprocessors 22 to the third handling substrate 30, the component devices 26 may be transferred from the component die 27 directly to the third handling substrate 30, or the component devices 26 may first be transferred to an intermediate transfer substrate, wherein in a following step the component devices 26 are transferred from the intermediate transfer substrate to the third handling substrate 30.

It is noted that the component devices 26 may be positioned on the third handling substrate 30 substantially adjacent to one of the memory devices 24 and the microprocessors 22, i.e., on the same level. In other embodiments, the component devices 26, memory devices 24 and the microprocessors 22 may be stacked, i.e., vertically stacked atop one another.

It is noted that in the operations depicted in Steps 1A-3A, it can be preferred to position using handle wafer, i.e., third handling wafer 30, to attach each unique heterogeneous die component, e.g., microprocessors 22, memory devices 24, component devices 26 (e.g., sensor), or subsystem element using the fewest multiple placements and join steps needed per component, e.g., microprocessors 22, memory devices 24, component devices 26, where possible to keep cost down and also to achieve high yield. In some embodiments, the number of components, e.g., microprocessors 22, memory devices 24, component devices 26 being transferred, e.g., transferred to the third supporting substrate 30, can range from 1 component, e.g., microprocessor 22, memory device 24, and/or component devices 26, to over 1,000,000 components, e.g., microprocessors 22, memory devices 24, and/or component devices 26, at one time.

In other examples, the number of separate components, e.g., microprocessors 22, memory devices 24, and/or component devices 26, being transferred to the third supporting substrate 30, as depicted in Steps 1A-3A, may be equal to 1, 5, 10 components, 50 components, 100 components, 1,000 components, 2,000 components, 3,000 components, 4,000 components, 5,000 components, 10,000 components, 50,000 components, 100,000 components, 250,000 components, 500,000 components, 1,000,000 components, 10,000,000 components, and any range of components including a lower limit and a lower limit provided by the aforementioned examples.

In some embodiments, subsequent to bonding all the heterogeneous die and components, i.e., microprocessors 22, memory devices 24, and/or component devices 26, options to deposit an oxide layer, e.g., $SiO_2$; a nitride layer, e.g., silicon nitride, or an alternative dielectric film can be made followed by lithography to open vias and wiring channels down to targeted I/O of the heterogeneous die and components, i.e., microprocessors 22, memory devices 24, and/or component devices 26, as copper or alternate metallurgies, create vias and wiring interconnections using standard semiconductor damascene or alternate methods of interconnection wiring.

Turning to Step 4A, the packaging components 28 from the packaging die 29 may be transferred to the assembly of components, e.g., microprocessor 22, memory device 24, and/or component devices 26, that have already been transferred to the third handling substrate 30 in accordance with Steps 1A-3A. The packaging components 28 include the electrical communication structures, e.g., wiring, that electrically interconnect the microprocessor 22, memory devices 24 and/or the component devices 26. The package components can include wiring and interconnections targeted for component. As depicted in FIG. 5, the packaging components 28 is stacked atop the layer of microprocessors 22, memory devices 24, and/or component devices 26 that have already been bonded to the third support substrate 30.

Mounting of the packaging components 28 to the level of microprocessors 22, memory devices 24, and/or component devices 26 that have been bonded to the third handling substrate 30 may include adhesives; deposited oxides, e.g., silicon oxide ($SiO_2$); deposited nitrides, e.g., silicon nitride; deposited metals, e.g., titanium; and barrier layers, such as deposited metal nitride, e.g., titanium nitride, tantalum nitride and combinations thereof. In other embodiments bonding of the packaging components 28 may include oxide to oxide bonding, such as thermal oxide bonding under thermal processing; laser bonding; or other alternate method as used in microelectronics fabrication. Similar to the transfer of the microprocessors 22, memory devices 24 and the component devices 26 to the third handling substrate 30, the packaging components 28 may be transferred from the packaging die 29 directly to the level of microprocessors 22, memory devices 24, and/or component devices 26 present on the third handling substrate 30, or the packaging components 28 may first be transferred to an intermediate transfer substrate, wherein in a following step the packaging components 28 are transferred from the intermediate transfer substrate to the level of microprocessors 22, memory devices 24, and/or component devices 26 present on third handling substrate 30. In other embodiments transfer of the packaging components 28 from the packaging die 29 to the level of microprocessors 22, memory devices 24, and/or component devices 26 present on third handling substrate 30 may employ a tape frame or other carrier. Following engagement of the packaging components 28, additional metal to metal bonding (Cu—Cu), and/or with oxide to oxide bonding may be applied for each attaché of multiple subcomponents.

Still referring to FIG. 5, at Step 5A solder balls, conductive adhesives or other electrically conductive structures that can provide a means of joining devices, may be formed in electrical communication with the interconnect structures in the packaging components 28 that provide electrical communication between sets of microprocessors 22, memory devices 24, and/or component devices 26. In accordance with solder bump processing, pads are metalized on the surface of the packaging components 28, and solder dots are deposited on each of the pads. The solder may be tin/lead based solder or may be lead free solder. The solder dots may be deposited using physical vapor deposition (PVD), such as plating or sputtering.

Additional barriers may be formed, e.g., to hermetically seal, the completed to pads or I/O, additional etching may be performed around each system or microsystem of heterogeneously integrated die, e.g., components and sensors, i.e., groupings of microprocessors 22, memory devices 24, packaging components 28 and/or component devices 26, followed by barrier coating deposition on top surface, such as with silicon oxide ($SiO_2$), silicon nitride (SiN) or alternate materials, to create a barrier layer joined to the backside barrier layer in the etched channels around subsystems or systems and across the top of the heterogeneous integrated system. By hermetically seal it is meant that the grouping of components, i.e., microprocessors 22, memory devices 24, and component devices 26 interconnected by a packaging components 28, are sealed from being exposed to an atmosphere, e.g., air, oxygen, and/or water.

At Step 6A, the third handling substrate 30 may be thinned, e.g., via backside thinning, and groupings of microprocessors 22, memory devices 24 and component devices 26 that are interconnected by the packaging components 28 may be separated from one another. Thinning may include planarizing, grinding, chemical mechanical planarization (CMP) and thinning by etching. Wafer thinning may also include spalling methods. Singulation (also referred to as die cutting or dicing) of the groupings of microprocessors 22, memory devices 24 and component devices 26 that are interconnected by the packaging components 28, can be achieved by cutting the third handling substrate 30 in the portions of the substrate that are separating separate grouping of components without damaging the circuits. In some other embodiments, singulation is performed using RIE or DRIE to form ultra narrow singulation cuts such as <2 to 20 microns, laser singulation for singulation at <5 to 30 microns or with a water-cooled circular saw with diamond-tipped teeth for singulation cuts typically of >30 microns. RIE or DRIE are preferred where applicable for greatest efficient use of a wafer provided the integration of the heterogeneous components can be accommodated with the thin spacing.

In some embodiments, the method depicted in FIG. 5 provides a method that is high speed, high volume, and low cost for precision handling, and assembling of structures, and equipment and fixtures to for providing electronic devices that are suitable for Internet of Things (IoT) applications, wearable devices, devices used in the health care field, devices for use with internet technology (IT) applications, devices in mobile applications, devices in industrial applications, home, robots, and/or automotive systems, sub components and solutions.

In some embodiments, the methods described herein provide for the use of precision pick and place fixtures, such as with glass, silicon (Si) or alternate materials to transfer die, die stacks, components, sub systems, packages, power sources, such as batteries, capacitors, alternate energy supply, wireless communication components, such as antenna, transducers, mirrors, light communications, optics, sensors, etc. toward assembly of components, subsystems, or systems, such as for IoT, Wearables, Health Care, IT, Mobile, industry, home, robots, automotive or other applications.

In some embodiments, the methods described herein provide for the use of bond and debond adhesives, as means to move 1 to >10,000, 000 chips, packages, components or other hardware at or near room temperature in an efficient and precise way to support precision X, Y and Z transfer with accuracies to <1 um per each pick, place and bonding/assembly transfer step.

In some embodiments, the methods described herein provide for the use of wafer to wafer, panel level processing, roll to roll processing using Si, Glass, polymer, metal, or other materials to maintain precision handling, placement and bonding for die, components, sub systems and systems. And/or alternatively use of self-assembly by means of surface tension, magnetics, gravity/vibration with fixture cavities, holes or structures or other means for component placement for bonding and assembly.

In some embodiments, the methods and structures provided herein allow for pick and place and bonding such using ultra-violet (UV) curing adhesive and precision fixtures, such as planar glass, silicon or non-planar glass, silicon or alternate fixture to pick multiple die, components or other hardware, transfer that hardware to a new surface, join and bond with solder, conductive adhesive, adhesive or alternate electrical conductor In some embodiments, equipment and fixtures are provided to pick and place and assemble precision multiple integrated sub-systems and systems. Note injected molded solder (IMS) may be deployed to bump a subset of die, sub-assemblies or components at a time using separate masks for the targeted fraction of components to be integrated per cycle.

Figure 6:
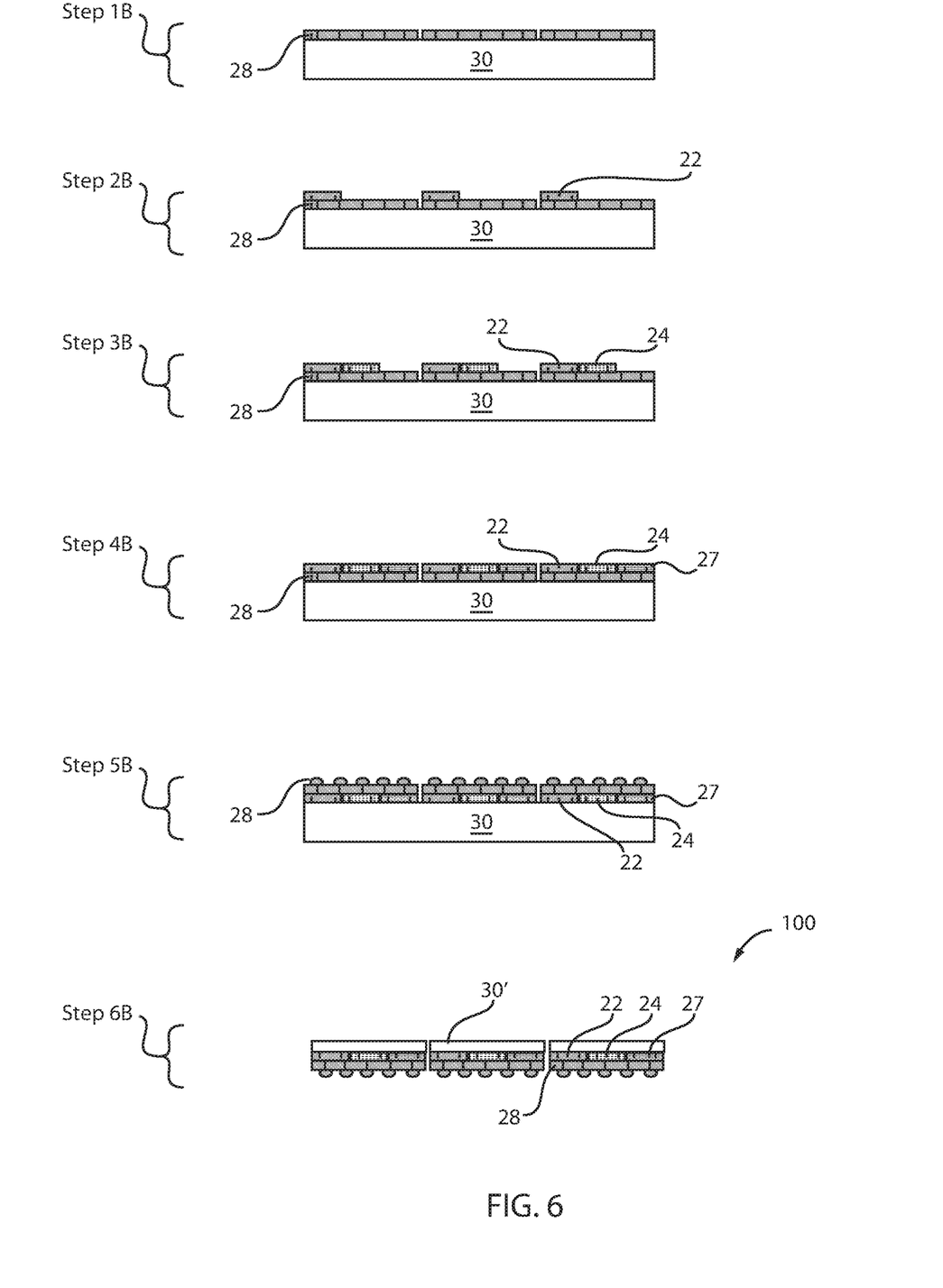
FIG. 6 is a side cross-sectional view depicting a process flow for creating components in accordance with a miniaturization platform, in which the process flow includes a package first wiring scheme, in accordance with one embodiment of the present disclosure.

FIG. 6 depicts a process flow for creating components in accordance with a miniaturization platform, in which the process flow includes a package first wiring scheme. The process flow depicted in FIG. 6, which may be referred to as package first integration with die to die wiring, is similar to the process flow that is described with reference to FIG. 5. Referring to Step 1B, a package layer, i.e., a layer composed of packaging components 28, is transferred from the packaging die 29 to the third handling substrate 30 to provide wiring and interconnections targeted for components from each die, i.e., microprocessors 22, memory devices 24 and/or components devices 26. The packaging components 28 can be mounted on a tape frame, handle wafer or other carrier, followed by metal to metal bonding (Cu—Cu), and/or with Oxide to oxide bonding for each attaché of multiple subcomponents.

Turning to Step 2B, the microprocessors 22 may be die mounted to the packaging components 28 that are already present on the third handling substrate 30. Step 2B is similar to Step 1A in FIG. 5. Therefore, the description of Step 1A with reference to process flow depicted in FIG. 5 is suitable for describing one embodiment of Step 2B of the process flow depicted in FIG. 6.

In a following process step, memory device 24 can be transferred from the memory die 23 to the packaging components 28 that are already present on the third handling substrate 30, at Step 3B. Step 3B that is illustrated in FIG. 6 is similar to Step 2A in FIG. 5. Therefore, the description of Step 2A with reference to process flow depicted in FIG.

5 is suitable for describing one embodiment of Step 3B of the process flow depicted in FIG. 6.

Referring to FIG. 6, at step 4B, component devices 26 from the component die 27 are transferred to the packaging components 28 that are already present on the third handling substrate 30. The component devices 26, the memory devices 24 and the microprocessors 22 are each vertically stacked on the packaging components 28. The component devices 26, memory devices 24 and microprocessors are adjacently positioned on the same level of the device structure depicted in FIG. 6. Step 4B that is illustrated in FIG. 6 is similar to Step 3A in FIG. 5. Therefore, the description of Step 3A with reference to process flow depicted in FIG. 5 is suitable for describing one embodiment of Step 4B of the process flow depicted in FIG. 6.

Step 5B of the process flow depicted in FIG. 6 illustrates one embodiment of solder bump metallization. A suitable description of solder bump metallization is provided by the description of Step 5A in FIG. 5.

Referring to FIG. 6, the process flow may continue with wafer thinning and singulation, as depicted in Step 6B. More specifically, the third handling substrate 30 may be thinned, e.g., via backside thinning, and groupings of microprocessors 22, memory devices 24 and component devices 26 that are interconnected by the packaging components 28 may be separated from one another. A further description for the process steps illustrated in Step 6B is provided above in the description of Step 6A of FIG. 5.

Post heterogeneous integration, the method can continue with testing (if needed), and the components can be sealed together with a variety of sealing solutions, such as metallic seal rings, e.g., with In, In alloys, lead free alloys such as SnAg or other metallic seal metals or alloys. In some embodiments, dielectric coatings and metal seals or overcoated metals, such as deposited Ti, dielectric inorganic coatings, such as $SiO_2$, SiN, or multiple layers of organic, inorganic and/or metallic layers, which can prevent oxygen, water and/or other liquids and gases from penetrating the system for a time period sufficient to provide the product to be acceptable during storage and in use. These coatings may protect the entire system or may only be used to protect the electronics for the system or subsystem while providing electrical, optical and/or wireless pass through for communications, power delivery or connection to external to the seal system functions that may include electrodes for bio electric, electro-chemical or optical diagnostics, sensing or monitoring, power delivery, antenna for RF communication, optical communications or other functions to serve the application such as but not limited one or more of the following: inductors, inductors and antenna, flexible antenna, flexible circuits, batteries, flexible batteries, sensors, bio-sensors, etc depending on system configuration and targeted applications(s).

Figure 7:
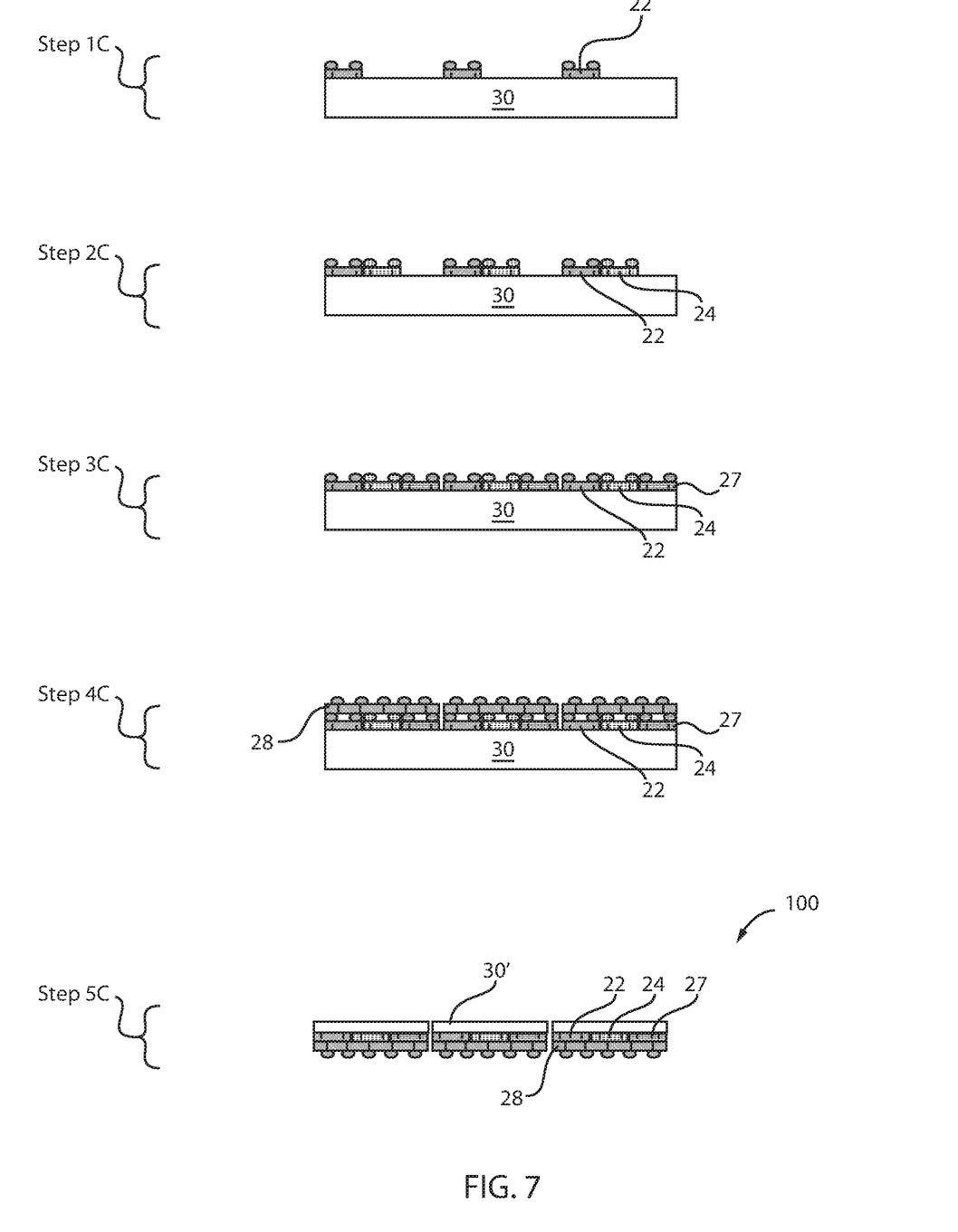
FIG. 7 is a side cross-sectional view depicting a process flow for creating components in accordance with a miniaturization platform, in which the process flow includes a die first solder interconnect scheme, in accordance with one embodiment of the present disclosure.

FIG. 7 depicts one embodiment of a process flow for creating components in accordance with a miniaturization platform, in which the process flow includes a die first solder interconnect scheme. The die first integration with solder interconnect/integration is similar to the integration scheme depicted in FIG. 5, with the exception that the method sequence depicted in FIG. 7 creates interconnections with solder bumps. In accordance with solder bump processing, pads are metalized on the surface of the microprocessor, and solder dots are deposited on each of the pads and/or pillars. The solder may be tin/lead based solder or may be lead free solder and may be solder to pad attach, solder to solder attach, pillar structures with metal and solder such as Cu/Solder or Cu/Ni/Solder. The solder dots may be deposited using physical vapor deposition (PVD), sputtering, evaporation, electrochemical plating, injection molded solder or alternate technique. In some embodiments, in addition to interconnections, a solder seal may be used to hermetically protect a portion or all of the system and can be created by alternatively creating interconnections with solder of components to a package level and through use of seal rings for creating sealed barriers for electronics sealing.

Step 1D that is depicted in FIG. 7 includes microprocessors 22 being die mounted to the third handling substrate 30 with the die input/output (I/O) facing upward. Step 1D depicted in FIG. 7 is similar to Step 1A as described above with reference to FIG. 5. Therefore, the above description of Step 1A referring to FIG. 5 is suitable for describing one embodiment of Step 1D in the process flow depicted in FIG. 7 with the exception that in Step 1D the process continues with forming solder bumps on the electrical contact pads of the microprocessors 22.

Step 2D of FIG. 7 includes transferring memory devices 24 from the memory die 23 to the third handling substrate 30. Step 2D depicted in FIG. 7 is similar to Step 2A as described above with reference to FIG. 5. Therefore, the above description of Step 2A referring to FIG. 5 is suitable for describing one embodiment of Step 2D in the process flow depicted in FIG. 7 with the exception that in Step 2D the process continues with forming solder bumps on the electrical contact pads of the memory devices 24.

Step 3D of the process flow depicted in FIG. 7 includes transferring the component devices 26 from the component die 27 to the third handling substrate 30 after the memory devices 24, and the microprocessors 22 have been transferred to the third handling substrate 30. In some examples, the component devices 26 may include batteries, and transmitters, or any of the devices that have been described above when describing the component die 27. Step 3D depicted in FIG. 7 is similar to Step 3A as described above with reference to FIG. 5. Therefore, the above description of Step 3D referring to FIG. 5 is suitable for describing one embodiment of Step 3D in the process flow depicted in FIG. 7 with the exception that in Step 3D the process continues with forming solder bumps on the electrical contact pads of the component devices 26.

Turning to Step 4D of the process flow depicted in FIG. 7, the packaging components 28 from the packaging die 29 may be transferred to the assembly of components, e.g., microprocessor 22, memory device 24, and/or component devices 26, that have already been transferred to the third handling substrate 30 in accordance with Steps 1D-3D. The packaging components 28 include the electrical communication structures, e.g., wiring, that electrically interconnect the microprocessor 22, memory devices 24 and/or the component devices 26. The package components can include wiring and interconnections targeted for component. As depicted in FIG. 7, the packaging components 28 is stacked atop the layer of microprocessors 22, memory devices 24, and/or component devices 26 that have already been bonded to the third support substrate 30.

Step 4D depicted in FIG. 7 is similar to Step 4A as described above with reference to FIG. 5. Therefore, the above description of Step 4A referring to FIG. 5 is suitable for describing one embodiment of Step 4D in the process flow depicted in FIG. 7 with the exception that in Step 4D the process electrical communication between the package components 28 and the plurality of microprocessors 22, memory devices 24 and component devices 24 is through solder bumps. Therefore, to provide an electrical junction through the solder bumps, a re-melt process may be applied using a heating method, such as solder reflow furnace, hot air or gas reflow, thermal compression bonding, laser bonding or alternate joining methodology.

In some embodiments, following bonding of the package components 28, individual assemblies of microprocessors 22, memory devices 24 and component devices 26, the assemblies of these components may be hermetically sealed. Sealing can be provided by deposited material, e.g., insulating materials, and underfill materials, such as oxides, nitrides and oxynitrides, metal seals and/or multiple layers of thin organic, inorganic and/or metal layers or metal seals to non pervious substrate or canister packages or inorganic seals for non-pervious substrates or canisters. In some embodiments, barrier coatings, e.g., insulating dielectrics, such as oxides, nitrides and oxynitrides, may deposited with the top surfaces to join with the insulating materials that are underfill materials or extended beneath the lower surfaces of the assemblies to create a barrier to the atmosphere.

Still referring to FIG. 7, at Step 5D solder balls, or other electrically conductive structures that can provide a means of joining devices, may be formed in electrical communication with the interconnect structures in the packaging components 28 that provide electrical communication between sets of microprocessors 22, memory devices 24, and/or component devices 26.

Referring to Step 6D of FIG. 7, the third handling substrate 30 may be thinned, e.g., via backside thinning, and groupings of microprocessors 22, memory devices 24 and component devices 26 that are interconnected by the packaging components 28 may be separated from one another. Step 6D of FIG. 7 is similar to Step 6A as described above with reference to FIG. 5. Therefore, the above description of Step 6A referring to FIG. 5 is suitable for describing one embodiment of Step 6D in the process flow depicted in FIG. 7.

Figure 8:
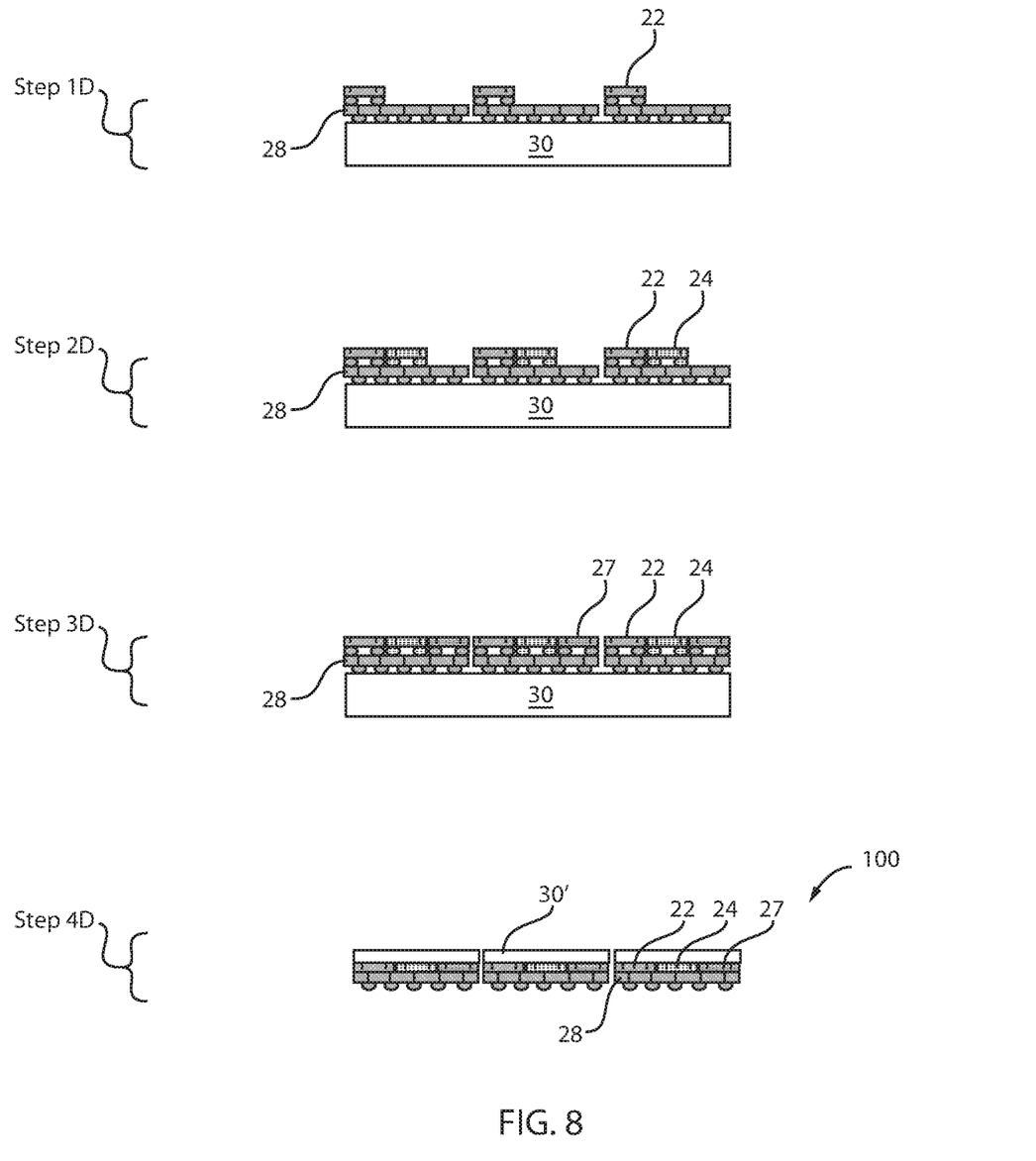
FIG. 8 is a side cross-sectional view depicting a process flow for creating components in accordance with a miniaturization platform, in which the process flow includes a package first solder interconnect scheme, in accordance with one embodiment of the present disclosure.

FIG. 8 depicts one embodiment of a process flow for creating components in accordance with a miniaturization platform, in which the process flow includes a package first solder interconnect scheme. The package first integration with solder interconnection/integration process flow depicted in FIG. 8 is similar to the process flow depicted in FIG. 6, with the exception that in the process flow depicted in FIG. 8, interconnections between microprocessors 22, memory devices 24 and component devices 26 is provide with solder to the base package. The process flow depicted in FIG. 8 also provides methods of applying sealing barriers for electronics sealing.

Referring to Step 1D, a package layer, i.e., a layer composed of packaging components 28, is transferred from the packaging die 29 to the third handling substrate 30 to provide wiring and interconnections targeted for components from each die, i.e., microprocessors 22, memory devices 24 and/or components devices 26. Step 1D also depicts the microprocessors 22 being die mounted to the packaging components 28 that are already present on the third handling substrate 30. Step 1D is similar to Step 1B and Step 2B in FIG. 6. Therefore, the description of Step 1B and 2B with reference to process flow depicted in FIG. 6 is suitable for describing one embodiment of Step 1D of the process flow depicted in FIG. 8. The difference between the process flow depicted in FIG. 6 and the process flow depicted in FIG. 8 is that the packaging components 28 are bonded to the third handling substrate 30 using solder bumps, and the microprocessors 22 are stacked and bonded to the packaging components 28 using solder bumps.

In a following process step, memory devices 24 can be transferred from the memory die 23 to the packaging components 28 that are already present on the third handling substrate 30, at Step 2D. Step 2D that is illustrated in FIG. 8 is similar to Step 3B in FIG. 6. Therefore, the description of Step 3B with reference to process flow depicted in FIG. 6 is suitable for describing one embodiment of Step 2D of the process flow depicted in FIG. 8. The difference between the process flow depicted in FIG. 6 and the process flow depicted in FIG. 8 is that the memory devices 24 are stacked and bonded to the packaging components 28 using solder bumps.

Referring to FIG. 8, at Step 3D, component devices 26 from the component die 27 are transferred to the packaging components 28 that are already present on the third handling substrate 30. The component devices 26, the memory devices 24 and the microprocessors 22 are each vertically stacked on the packaging components 28. The component devices 26, memory devices 24 and microprocessors are adjacently positioned on the same level of the device structure depicted in FIG. 8. Step 3D that is illustrated in FIG. 8 is similar to Step 4B of the process flow depicted in FIG. 6. Therefore, the description of Step 4B with reference to process flow depicted in FIG. 6 is suitable for describing one embodiment of Step 3D of the process flow depicted in FIG. 8. The difference between the process flow depicted in FIG. 6 and the process flow depicted in FIG. 8 is that the component devices 26 are stacked and bonded to the packaging components 28 using solder bumps.

In some embodiments, following bonding of the package components 28, individual assemblies of microprocessors 22, memory devices 24 and component devices 26, the assemblies of these grouped structures may be hermetically sealed. Sealing can be provided by deposited material, e.g., insulating materials, and underfill materials, such as oxides, nitrides and oxynitrides. In some embodiments, barrier coatings, e.g., insulating dielectrics, such as oxides, nitrides and oxynitrides, dielectrics, metal coatings and metal seals which may be deposited with the top surfaces to join with the insulating materials that can include dielectric underfill adhesive materials or be coatings that seal to package surfaces that may be impermeable to moisture or gases and therefore provide a barrier to the atmosphere.

Referring to FIG. 8, the process flow may continue with wafer thinning and singulation, as depicted in Step 4D. More specifically, the third handling substrate 30 may be thinned, e.g., via backside thinning, and groupings of microprocessors 22, memory devices 24 and component devices 26 that are interconnected by the packaging components 28 may be separated from one another.

Post heterogeneous integration, the method can continue with testing (if needed), and the components can be sealed together with metal seals, dielectric and/or metal coatings $SiO_2$, SiN, or other coatings through to the package level using etched or laser channels and top coatings to create sealed components that can later be joined to antenna, flexible circuits, sensors, batteries, etc depending on system configuration.

The integrated/miniaturized electronic sub-assemblies 100, such as the assemblies formed using the process flow described in FIGS. 5-8, or derivatives of these processes, where integrated sub assembly components which may be isolated from other electronics by means of hermitic packaging with Ti, SiN, $SiO_2$ layers or combinations of layers and size may be much smaller 10's of microns in X & Y and Z than other system components and may be on package or largest die of subassembly. Other components by comparison may be millimeter (mm) size or larger in many applications and may include integration with additional sensors, antenna, batteries, or other components that may be on larger scale X-Y footprint for integrated system.

Figure 9:
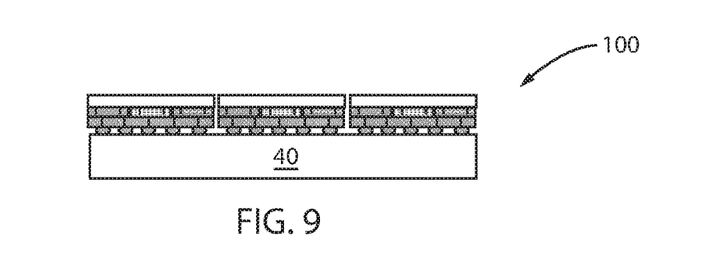
FIG. 9 is a side cross-sectional view depicting mounting the integrated/miniaturized electronic sub-assemblies to another handling substrate for transfer to a panel level process or roll to roll process.
Figure 10:
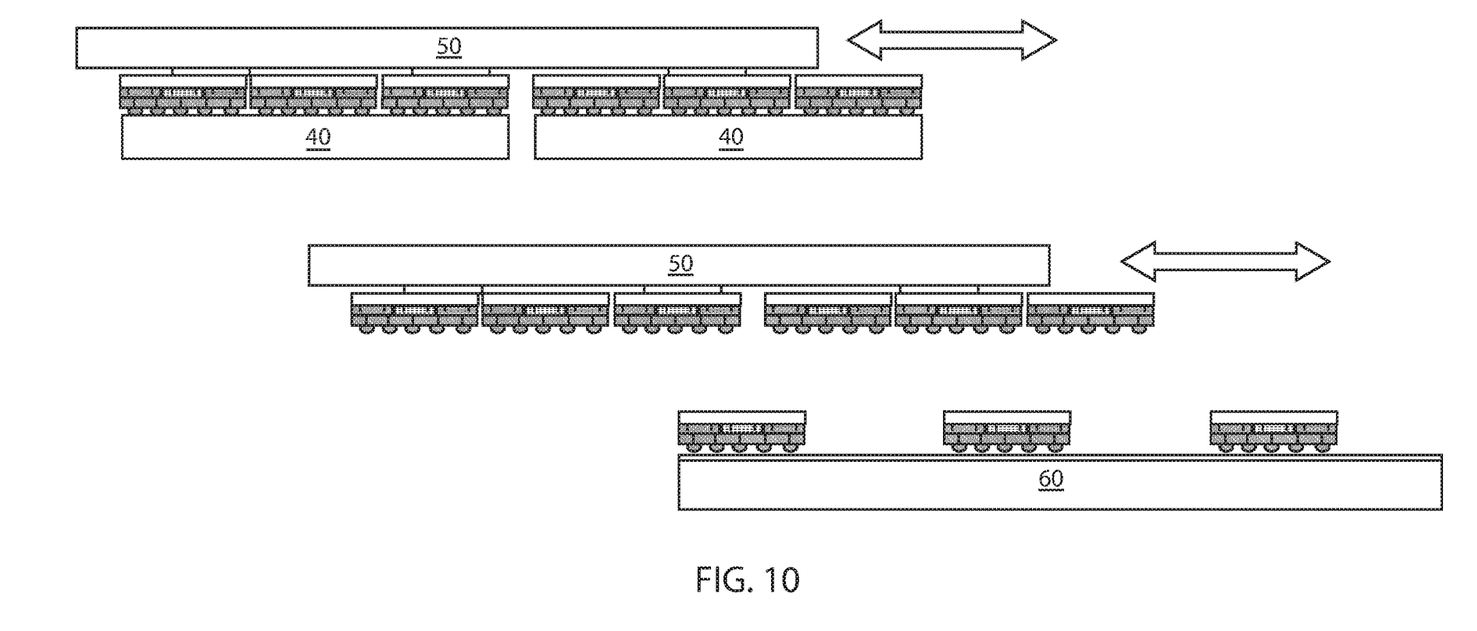
FIG. 10 is a side cross-sectional view depicting transferring the integrated/miniaturized electronic sub-assemblies a panel level process or roll to roll process.

Referring to FIGS. 9 and 10, the integrated sub components, i.e., integrated/miniaturized electronic sub-assemblies 100, can then be integrated with larger components where the smaller 10's of micron integrated electronic sub-assemblies can then be integrated using roll to roll processing or panel level process or alternate for low cost of high volume integrated internet of things (IoT), Wearables or other micro systems, nano systems, and combinations thereof. FIG. 9 depicts mounting the integrated/miniaturized electronic sub-assemblies to a fourth handling substrate 40 for transfer to a panel level process or roll to roll process. FIG. 10 is a side cross-sectional view depicting transferring the integrated/miniaturized electronic sub-assemblies 100 to a product level substrate 50, 60 by a panel level process or roll to roll process.

In some embodiments, a structure, method and system application for use of electronic system into a small integration platform or package is provided by above disclosure. The structure and size/form factor can consist of ultra thin/ultra small electronics/optics package platform such as Si, metal, glass, ceramic or composite from <50 µm to 5000 µm thick and <50 mm² area to thickness of <500 nm, and area of less than 5000 µm², to sizes smaller than 50 µm³ to 500 µm³ in volume. The structure can consist of an integrated small electronics with microprocessor, memory, energy source, such as battery, capacitors, and/or energy harvesting device(s), rf antenna, NFC antenna, optical communications, wired or wireless, sensors, package or hermetic package, nano or micro channels, wiring and interconnection. The structure can consist can use rigid and/or flexible members, and/or packaged electronics integration and thinned silicon package form factor with integrated wiring, wire bonding and/or wireless interconnection and flip chip connection or alternative component interconnection to interconnect small sub-components. The structure can be employed for system and/or subsystem prototyping, demonstrations and/or volume manufacturing of sensors, smart tags, or other systems or sub components. Sizes of package and integrated function can be from under 50 µm in the X, Y and Z directions to multiple millimeter (mm) is size.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A heterogeneous electrical device comprising:
   a support substrate;
   a microprocessor device on a first portion of the support substrate;
   a memory device on a second portion of the support substrate;
   a field programmable gateway array (FPGA) device on a third portion of the support substrate;
   a component device on a fourth portion of the support substrate; and
   a package component electrically interconnecting the microprocessor device, memory device and component device, wherein a geometry of the heterogeneous electrical device has a volume of 1 mm³ or less.

2. The heterogeneous electrical device of claim 1, wherein the support substrate is a semiconductor material having a thickness ranging from 10 microns to 50 microns.

3. The heterogeneous electrical device of claim 1, wherein the component device is selected from the group consisting of sensors, optical, radio frequency (RF) transmitters and receivers, near field communication (NFC), inductors, sound communication, batteries, capacitors, photovoltaics, and combinations thereof.

4. The heterogeneous electrical device of claim 1, wherein the package component is on the support substrate.

5. The heterogeneous electrical device of claim 4, wherein said memory device, said microprocessor device and said component device are stacked on the package component.

6. The heterogeneous electrical device of claim 5, wherein said memory device, said microprocessor device and said component device are present on the support substrate.

7. The heterogeneous electrical device of claim 6, wherein the package component is stacked on a level of said memory device, said microprocessor device and said component device.

8. The heterogeneous electrical device of claim 1, wherein at least one electrical device that is selected from the group consisting of the microprocessor device, the memory device, the field programmable gateway array device, the package components and combinations thereof is hermetically sealed.

9. A heterogeneous electrical device comprising:
   a microprocessor device;
   a memory device;
   a field programmable gateway array (FPGA) device; and
   a component device;
   a package component electrically interconnecting the microprocessor device, the memory device and the component device, wherein at least one of electrical devices selected from the group consisting of the microprocessor device, the memory device, the field programmable gateway array device, the package components and combinations thereof is hermetically sealed, a geometry of the heterogeneous electrical device has a volume of 1 mm³ or less.

10. The heterogeneous electrical device of claim 9, wherein at least the microprocessor device is present on a support substrate.

11. The heterogeneous electrical device of claim 9, wherein the package component is on a support substrate, and said memory device, said microprocessor device and said component device are stacked on the packaging component.

12. A heterogeneous electrical device comprising:
a support substrate;
a microprocessor device on a first portion of the support substrate;
a memory device on a second portion of the support substrate;
a field programmable gateway array (FPGA) device on a third portion of the support substrate;
a component device on a fourth portion of the support substrate; and
a package component electrically interconnecting the microprocessor device, the memory device and the component device, wherein a geometry of the heterogeneous electrical device has a volume of 1 mm$^3$ or less, wherein said memory device, said microprocessor device and said component device are present on the support substrate, and the package component is stacked on a level of said memory device, said microprocessor device and said component device that are present on the support substrate.

13. The heterogeneous electrical device of claim 12, wherein the support substrate is a semiconductor material having a thickness ranging from 10 microns to 50 microns.

14. The heterogeneous electrical device of claim 12, wherein the component device is selected from the group consisting of sensors, optical, radio frequency (RF) transmitters and receivers, near field communication (NFC), inductors, sound communication, batteries, capacitors, photovoltaics, and combinations thereof.

15. The heterogeneous electrical device of claim 12, wherein at least one electrical device that is selected from the group consisting of the microprocessor device, the memory device, the field programmable gateway array device, the package components and combinations thereof is hermetically sealed.

16. The heterogeneous electrical device of claim 12, wherein the microprocessor device is selected from the group consisting of field effect transistors (FET), fin type field effect transistors (FinFETs), bipolar junction transistors (BJTs), nanowire, FET and/or BJT sensors, thin film transistors (TFTs) and combinations thereof.

17. The heterogeneous electrical device of claim 12, wherein the memory device is selected from the group consisting of random access memory (RAM), dynamic random access memory (DRAM), embedded dynamic access memory (EDRAM), flash memory and combinations thereof.

18. The heterogenous electrical device of claim 12, wherein the component device is a resistor or a capacitor.

19. The heterogenous electrical device of claim 12, wherein the component device is a sensor selected from the group consisting of light wavelength sensors, resistance sensors, heat sensors, bio-nano sensors, bio-electro-chemical sensors, optical sensors, electrical sensors and combinations thereof.

* * * * *